US011769069B2

(12) United States Patent
Jin et al.

(10) Patent No.: US 11,769,069 B2
(45) Date of Patent: Sep. 26, 2023

(54) SUPERCONDUCTING CIRCUIT STRUCTURE, SUPERCONDUCTING QUANTUM CHIP AND SUPERCONDUCTING QUANTUM COMPUTER

(71) Applicant: Beijing Baidu Netcom Science and Technology Co., Ltd., Beijing (CN)

(72) Inventors: Lijing Jin, Beijing (CN); Runyao Duan, Beijing (CN)

(73) Assignee: Beijing Baidu Netcom Science and Technology Co., LTD, Beijing (CN)

( * ) Notice: Subject to any disclaimer, the term of this patent is extended or adjusted under 35 U.S.C. 154(b) by 495 days.

(21) Appl. No.: 17/022,175

(22) Filed: Sep. 16, 2020

(65) Prior Publication Data

US 2021/0192380 A1 Jun. 24, 2021

(30) Foreign Application Priority Data

Dec. 24, 2019 (CN) ......................... 201911346962.1

(51) Int. Cl.
*H03K 3/38* (2006.01)
*G06N 10/40* (2022.01)
(Continued)

(52) U.S. Cl.
CPC ............. *G06N 10/40* (2022.01); *G06F 13/20* (2013.01); *H03K 3/38* (2013.01); *H03K 19/195* (2013.01)

(58) Field of Classification Search
None
See application file for complete search history.

(56) References Cited

U.S. PATENT DOCUMENTS 7,613,765 B1 * 11/2009 Hilton .................... G06N 10/00 708/801
10,235,635 B1 3/2019 Abdo
(Continued)

FOREIGN PATENT DOCUMENTS

CN 108038549 A 5/2018
CN 109784492 A 5/2019
(Continued)

OTHER PUBLICATIONS

Dec. 26, 2022—(CN) First Examination Report—App. No. 201911346962.1.

(Continued)

*Primary Examiner* — Elias Mamo
(74) *Attorney, Agent, or Firm* — Banner & Witcoff, Ltd.

(57) ABSTRACT

A superconducting circuit structure, a superconducting quantum chip, and a superconducting quantum computer are provided, which are related to a field of quantum computing. The specific implementation includes: a superconducting circuit structure, including: at least three computational qubits; a bus qubit connected to the respective computational qubits, wherein couplings between two of the computational qubits connected by the bus qubit are equivalent; and coupler qubits disposed between the respective computational qubits and the bus qubit, to connect the respective computational qubits to the bus qubits, wherein the coupler qubit is configured to regulate coupling strength between the computational qubit and the bus qubit. Couplings between any two computational qubits may be realized, so that an operation of a quantum gate between any two computational qubits is achieved, while crosstalk between computational qubits may be effectively suppressed.

19 Claims, 6 Drawing Sheets

(51) Int. Cl.
*G06F 13/20* (2006.01)
*H03K 19/195* (2006.01)

(56) References Cited

U.S. PATENT DOCUMENTS

| | | | | |
|---|---|---|---|---|
| 10,423,888 | B1 * | 9/2019 | Hertzberg | H10N 99/05 |
| 10,540,604 | B1 * | 1/2020 | Papageorge | G06F 13/36 |
| 10,546,993 | B2 * | 1/2020 | Ferguson | H10N 60/805 |
| 2016/0125309 | A1 * | 5/2016 | Naaman | B82Y 10/00 326/3 |
| 2017/0212860 | A1 | 7/2017 | Naaman et al. | |
| 2018/0260729 | A1 * | 9/2018 | Abdo | G06N 99/00 |
| 2020/0285987 | A1 * | 9/2020 | von Salis | H10N 69/00 |

FOREIGN PATENT DOCUMENTS

| | | | |
|---|---|---|---|
| CN | 109784493 | A | 5/2019 |
| CN | 109840596 | A | 6/2019 |
| CN | 110472740 | A | 11/2019 |
| JP | 2015165623 | A | 9/2015 |
| WO | 2019179741 | A1 | 9/2019 |

OTHER PUBLICATIONS

Jan. 4, 2023—(CN) Office Action—App. No. 201911346962.1.

McKay, . et al., “A universal gate for fixed-frequency qubits via a tunable bus”, Physical Review Applied, vol. 6, No. 6, 2016.

Arute, F. et al., “Quantum supremacy using a programmable superconducting processor”, Nature, vol. 574, No. 7779, Oct. 2019.

Yan, F. et al., “Tunable coupling scheme for implementing high-fidelity two-qubit gates”, Physical Review Applied, vol. 10, No. 5, 2018.

Song, C. et al., “Generation of multicomponent atomic Schrodinger cat states of up to 20 qubits”, Science, vol. 365, No. 6453, Aug. 2019.

Wending, G., “Quantum Information Processing with Superconducting Circuits: a Review”, Reports on Progress in Physics, vol. 80, No. 10, 2017.

* cited by examiner

SUPERCONDUCTING CIRCUIT STRUCTURE, SUPERCONDUCTING QUANTUM CHIP AND SUPERCONDUCTING QUANTUM COMPUTER

CROSS-REFERENCE TO RELATED APPLICATION

This application claims priority to Chinese patent application No. 201911346962.1, filed on Dec. 24, 2019, which is hereby incorporated by reference in its entirety.

TECHNICAL FIELD

The present application relates to the field of computers, and in particular to the field of quantum computing.

BACKGROUND

Quantum computing is a new computing method that is expected to surpass classical computing in solving certain issues. There are multiple potential hardware implementations to achieve quantum computing. At present, the most popular candidates for quantum hardware with certain performance include an ion trap platform and a superconducting circuit platform. Benefiting from the proven technology of complementary metal oxide semiconductor (CMOS) in semiconductor integrated circuit, a superconducting circuit platform is favored by the industry due to its better scalability. Recently, Google has achieved quantum supremacy on a chip with 53 superconducting qubits. However, one thing that may not be ignored is that the connectivity between qubits in a superconducting circuit platform is poor, a qubit may only be coupled with adjacent qubits. Due to this limitation, a two-qubit gate may only be implemented between adjacent qubits. However, in many practical tasks, not only a coupling between adjacent qubits, but also a coupling between non-adjacent qubits is required. That is, in many practical tasks, an operation of a quantum gate between any two qubits needs to be implemented.

Therefore, a superconducting circuit structure is needed, which may implement an operation between non-adjacent qubits in a superconducting circuit platform, while effectively suppressing crosstalk between qubits.

SUMMARY

In embodiments of the present application, a superconducting circuit structure, a superconducting quantum chip, and a superconducting quantum computer are provided, based on which, a coupling between any two computational qubits may be realized, so that an operation of a quantum gate between any two computational qubits is achieved, while crosstalk between computational qubits may be effectively suppressed.

In a first aspect, a superconducting circuit structure is provided in an embodiment of the present application, including:

at least three computational qubits;

a bus qubit connected to the respective computational qubits, wherein couplings between two of the computational qubits connected by the bus qubit are equivalent; and coupler qubits disposed between the respective computational qubits and the bus qubit, to connect the respective computational qubits to the bus qubit, wherein the coupler qubit is configured to regulate coupling strength between the computational qubits and the bus qubits.

In an embodiment of the present application, since a bus qubit is introduced, computational qubits are indirectly coupled by the bus qubit. In this way, a coupling between any two computational qubits is realized, and a full connectivity of computational qubits is achieved, which facilitates an operation of a quantum gate between any two computational qubits. Additionally, since in an embodiment of the present application, a coupler qubit is introduced, and the coupler qubit is disposed between a bus qubit and a computational qubit, coupling strength between a computational qubit and a bus qubit may be regulated by the coupler qubit. Further, a coupling between any two computational qubits may even be turned off by a coupler qubit. Therefore, crosstalk between computational qubits is effectively avoided.

Therefore, in an embodiment of the present application, a solution is provided for enabling an operation between non-adjacent qubits in a superconducting circuit platform, while effectively suppressing crosstalk between computational qubits.

In an implementation, the computational qubit, the bus qubit, and the coupler qubit have a same circuit structure or different circuit structures.

In an embodiment of the present application, in order to minimize different types of introduced devices, a computational qubit, a bus qubit, and a coupler qubit may have a same structure, such as a same qubit structure. Certainly, for actual functional requirements or for other needs, structures of a computational qubit, a bus qubit, and a coupler qubit may also be different, which facilitates engineering applications.

In an implementation, the bus qubit is a resonator.

In an implementation, the bus qubit includes a superconducting quantum interference device, and/or the computational qubit includes a superconducting quantum interference device, and/or the coupler qubit includes a superconducting quantum interference device.

In an implementation, the superconducting quantum interference device includes two Josephson junctions connected in parallel.

In an embodiment of the present application, by a magnetic field generated by a current flowing through a Josephson junction chain in a superconducting quantum interference device, a magnetic flux passing through a computational qubit, a bus qubit or a coupler qubit may be changed, and the frequency of a computational qubit, a bus qubit or a coupler qubit is changed, so that a coupling between a computational qubit, a bus qubit and a coupler qubit is realized, which facilitates a coupling between any two computational qubits.

In an implementation, the bus qubit further includes a first noise reduction structure configured to reduce a charge fluctuation noise in an environment in which the bus qubit is located; and/or the computational qubit further includes a second noise reduction structure configured to reduce a charge fluctuation noise in an environment in which the computational qubit is located; and/or the coupler qubit further includes a third noise reduction structure configured to reduce a charge fluctuation noise in an environment in which the coupler qubit is located.

In an implementation, the bus qubit further includes a capacitor connected in parallel with the superconducting quantum interference device, wherein the capacitor is configured to reduce a charge fluctuation noise in an environment in which the bus qubit is located; and/or the computational qubit further includes a capacitor connected in parallel with the superconducting quantum interference device, wherein the capacitor is configured to reduce a charge fluctuation noise in an environment in which the computational qubit is located; and/or the coupler qubit further includes a capacitor connected in parallel with the superconducting quantum interference device, wherein the capacitor is configured to reduce a charge fluctuation noise in an environment in which the coupler qubit is located.

In an implementation, the superconducting circuit structure further includes a first connector, a second connector, and a third connector, wherein a first end of the bus qubit is connected to a first end of the computational qubit through the first connector, a second end of the bus qubit is connected to a first end of the coupler qubit through the second connector, and a second end of the computational qubit is connected to a second end of the coupler qubit through the third connector.

In an implementation, the first connector, the second connector, and the third connector are one of: a capacitor, a Josephson junction, and a resonator;

wherein the first connector, the second connector, and the third connector are the same or different.

In a second aspect, a superconducting quantum chip is provided in an embodiment of the present application. At least a superconducting circuit structure is formed on the superconducting quantum chip, wherein the superconducting circuit structure includes:

at least three computational qubits;

a bus qubit connected to the respective computational qubits, wherein couplings between two of the computational qubits connected by the bus qubit are equivalent; and coupler qubits disposed between the respective computational qubits and the bus qubit, to connect the respective computational qubits to the bus qubit, wherein the coupler qubit is configured to regulate coupling strength between the computational qubit and the bus qubit.

In a third aspect, a superconducting quantum computer is provided in an embodiment of the present application, which is provided at least with a superconducting quantum chip and a control and reading device connected to the superconducting quantum chip, wherein the superconducting quantum chip has the superconducting circuit structure including:

at least three computational qubits;

a bus qubit connected to the respective computational qubits, wherein couplings between two of the computational qubits connected by the bus qubit are equivalent; and coupler qubits disposed between the respective computational qubits and the bus qubit, to connect the respective computational qubits to the bus qubit, wherein the coupler qubit is configured to regulate coupling strength between the computational qubit and the bus qubit.

An above embodiment in the application has the following advantages or beneficial effects:

Since a bus qubit is introduced, computational qubits are indirectly coupled by the bus qubit. In this way, a coupling between any two computational qubits is realized, and a full connectivity of computational qubits is achieved, which facilitates an operation of a quantum gate between any two computational qubits. Additionally, since in an embodiment of the present application, a coupler qubit is introduced, and the coupler qubit is disposed between a bus qubit and a computational qubit, coupling strength between the computational qubit and the bus qubit may be regulated by the coupler qubit. Further, a coupling between any two computational qubits may even be turned off by the coupler qubit. Therefore, crosstalk between computational qubits is effectively avoided, which provides a solution for enabling an operation between non-adjacent qubits in a superconducting circuit platform, while effectively suppressing crosstalk between computational qubits.

Other effects of the foregoing alternative implementations will be described below with reference to specific embodiments.

BRIEF DESCRIPTION OF THE DRAWINGS

The drawings are illustrated only for better understanding the present application, rather than being restrictive to the present application, in which.

DETAILED DESCRIPTION OF EMBODIMENTS

Exemplary embodiments of the present application are described below with reference to the accompanying drawings, where various details of embodiments of the present application are included to facilitate understanding. The drawings and the description should be considered as illustrative in nature. Therefore, as can be appreciated by those ordinary skilled in the art, the described embodiments may be changed and modified in different ways, without departing from the scope or spirit of the present application. Also, for clarity and conciseness, descriptions of well-known functions and structures are omitted in the following description.

A basic unit of a superconducting quantum chip is a superconducting qubit (referred to as a qubit in embodiments of the present application). Most of the existing technical implementation schemes adopt transmon qubits, the difference thereof merely lies in the architecture of the qubits, that is, the arrangement and coupling of the qubits are different. Depending on different application scenarios, the architecture of qubits may be roughly divided into the two categories. For the first category, qubits are directly or indirectly coupled with adjacent qubits; and for the second category, multiple qubits are connected by a resonator (also referred to as a quantum bus). Although the schemes of these two categories have their own advantages, they also suffer shortcomings.

Figure 1A:
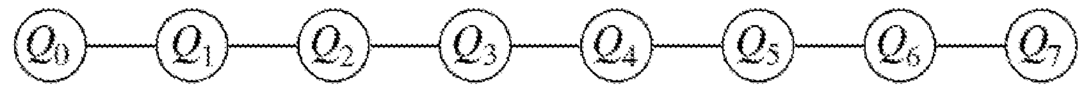
FIG. 1A is a schematic diagram showing an arrangement of qubits ($Q_0$-$Q_7$) in a one-dimensional linear structure.
Figure 1B:
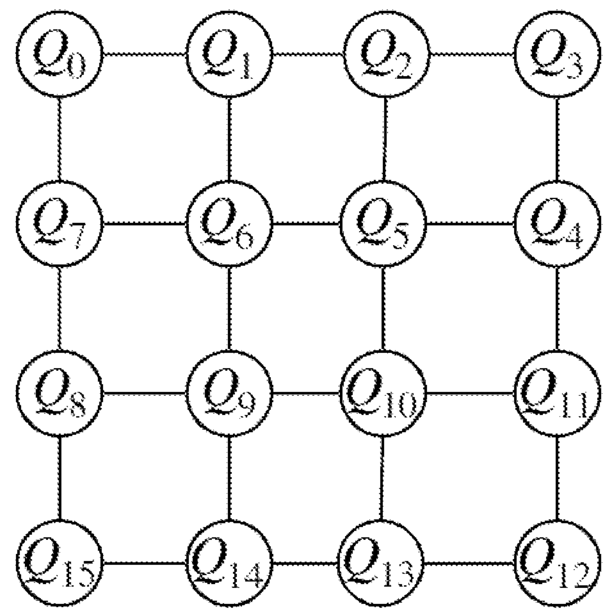
FIG. 1B is a schematic diagram showing an arrangement of qubits ($Q_0$-$Q_{15}$) in a two-dimensional checkerboard structure.
Figure 1C:
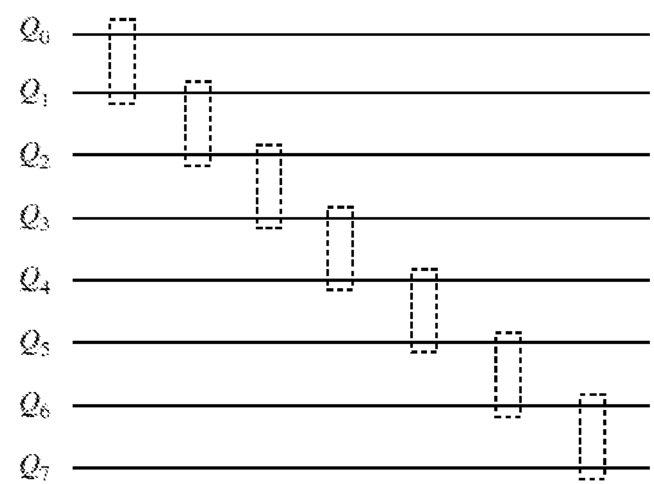
FIG. 1C is a schematic diagram showing a structure with seven adjacent qubit gates obtained by decomposing the structure shown in FIG. 1A.

Specifically, for the first category, adjacent qubits are coupled by a capacitor (e.g., as in the following literature by Julian Kelly, Rami Barends, Austin G Fowler, Anthony Megrant, Evan Je_rey, Theodore C. White, Daniel Sank, Josh Y Mutus, Brooks Campbell, Yu Chen, et al; State preservation by repetitive error detection in a superconducting quantum circuit; Nature 519, 66 (2015)), a resonator (e.g., as in the following literature by Córcoles, Antonio D., et al; Demonstration of a quantum error detection code using a square lattice of four superconducting qubits; Nature communications 6, 6979 (2015)), or a coupler (e.g., as in the following literature by Frank Arute, Kunal Arya, Ryan Babbush, Dave Bacon, Joseph C Bardin, Rami Barends, Rupak. Biswas, Sergio Boixo, Fernando G S L Brandao, David A Buell, et al; Quantum supremacy using a programmable superconducting processor; Nature 574, 505 (2019)). Multiple qubits may be arranged in a one-dimensional line. As shown in FIG. 1A, qubits ($Q_0$-$Q_7$) are arranged in a one-dimensional linear structure, where each qubit is only coupled with adjacent qubits. Here, FIG. 1C illustrates an architecture based on the one-dimensional linear qubit structure in FIG. 1A. In practical applications, if a quantum gate is to be implemented between qubits $Q_0$ and $Q_7$, it needs to be decomposed into seven adjacent qubit gates. Further, for this category, a two-dimensional checkerboard structure is also applicable. As shown in FIG. 1B, qubits ($Q_0$-$Q_{15}$) are arranged in a two-dimensional checkerboard structure, where each qubit is only coupled with adjacent qubits. For this category, no matter a one-dimensional or two-dimensional structure, qubits may only interact with adjacent qubits, and cannot be coupled with other qubits. That is, a two-qubit gate must be generated between adjacent qubits. Therefore, by using this scheme, the connectivity between qubits is poor.

In practical applications, for a scheme with the first category, if a two-qubit gate is to be implemented between non-adjacent qubits, a decomposition must be applied. For example, if a two-qubit gate is to be implemented between qubits $Q_0$ and $Q_7$ as shown in FIG. 1A, quantum gates are required to be implemented sequentially between $Q_0$ and $Q_1$, $Q_1$ and $Q_2$, $Q_2$ and $Q_3$, $Q_3$ and $Q_4$, $Q_4$ and $Q_5$, $Q_5$ and $Q_6$, and $Q_6$ and $Q_7$, respectively. That is, an architecture shown in FIG. 1C is to be implemented. In this way, as the depth of a quantum circuit is inevitably increased, the fidelity of an entire calculation will be greatly reduced. Additionally, since the coherence time of a superconducting qubit is limited, a circuit depth is not allowed to be too large.

Figure 2:
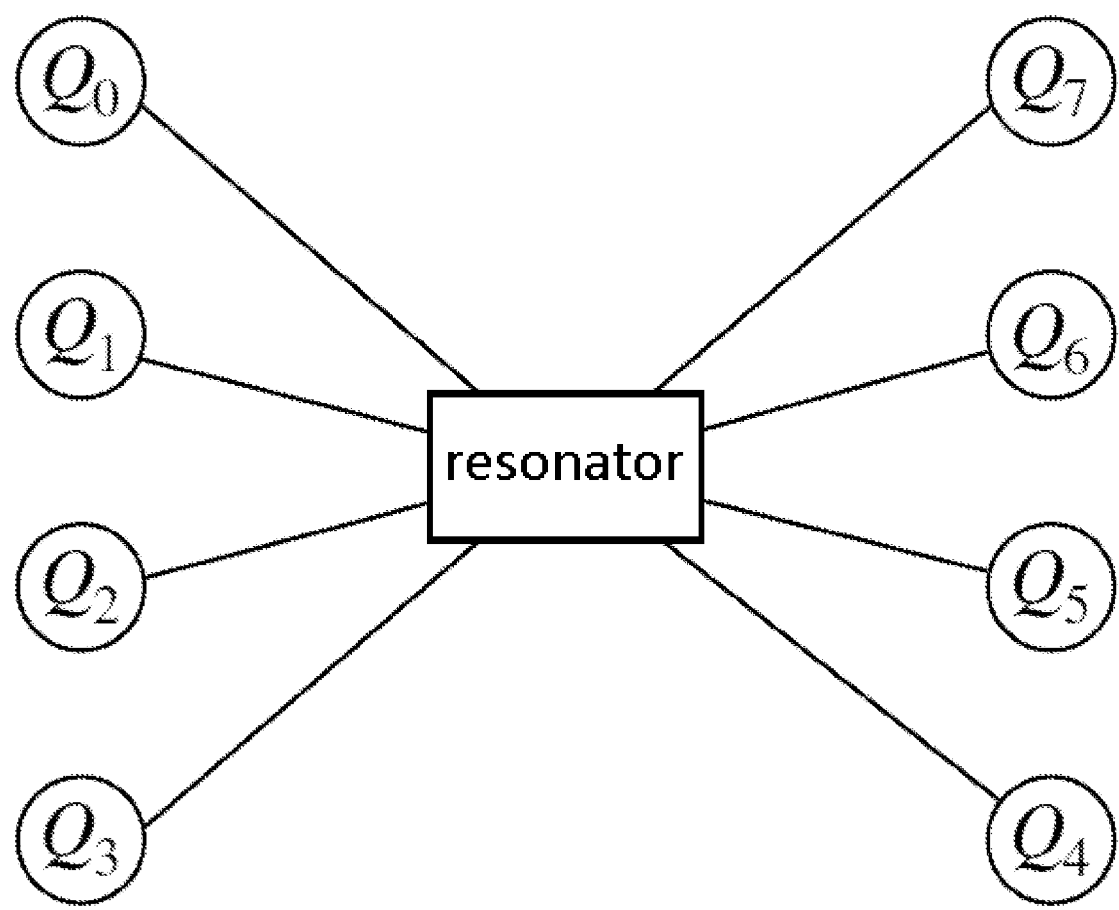
FIG. 2 is a schematic diagram showing a coupling of qubits ($Q_0$-$Q_7$) by a common resonator.

For the second category, multiple qubits are coupled together by a common resonator, and each of the qubits is coupled to the resonator, to form a star-shaped topology (e.g., as in the following literature by Song, Chao, et al; 10-qubit entanglement and parallel logic operations with a superconducting. Circuit; Physical review letters 119, 180511 (2017)), as shown in FIG. 2. In this way, couplings between each two qubits are equivalent. Such a design is usually configured for achieving quantum entanglement between multiple qubits, such as forming a Greenberger-Horne-Zeilinger state. In the scheme, a common resonator is introduced, so as to achieve equivalent couplings between arbitrary qubits. In this way, two-qubit gates between arbitrary qubits are realized and the connectivity between qubits is relatively good. However, one issue that cannot be ignored is that crosstalk between qubits is very large, that is, if one of the qubits is manipulated, the other qubits are all affected.

Therefore, a superconducting circuit structure is needed, which may implement an operation between non-adjacent qubits while effectively suppressing crosstalk between qubits.

In view of above, in embodiments of the present application, a superconducting circuit structure, a superconducting quantum chip, and a superconducting quantum computer are provided, such that an operation between non-adjacent computational qubits may be implemented in a superconducting circuit platform, while crosstalk between computational qubits may be effectively suppressed. Specifically, in embodiments of the present application, a bus qubit and a coupler qubit are introduced. Therefore, the connectivity and crosstalk between superconducting qubits are both considered, thereby realizing fully connected quantum gates with high fidelity among multiple qubits.

It should be noted herein that the superconducting circuit structure in embodiments of the present application refers to a circuit implemented by using a superconducting device, that is, components used in the superconducting circuit structure are made of superconducting materials.

Figure 3:
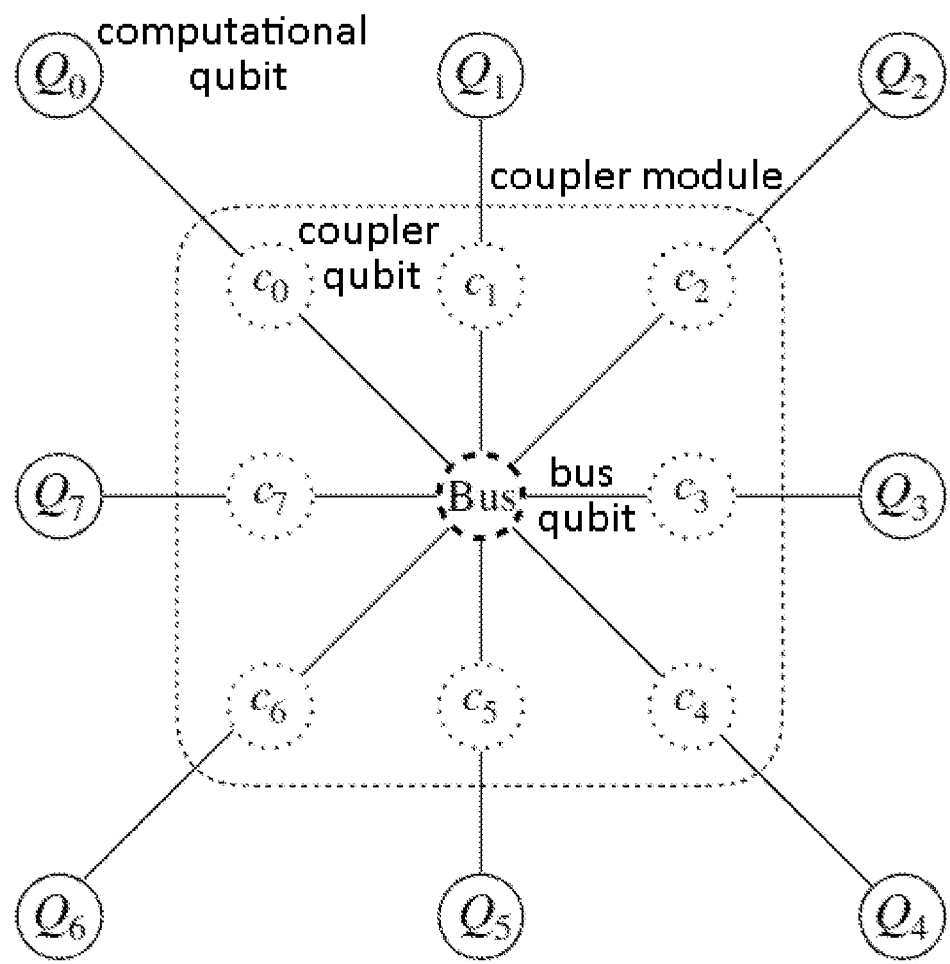
FIG. 3 is a schematic diagram showing a superconducting circuit structure according to an embodiment of the present application.
Figure 5:
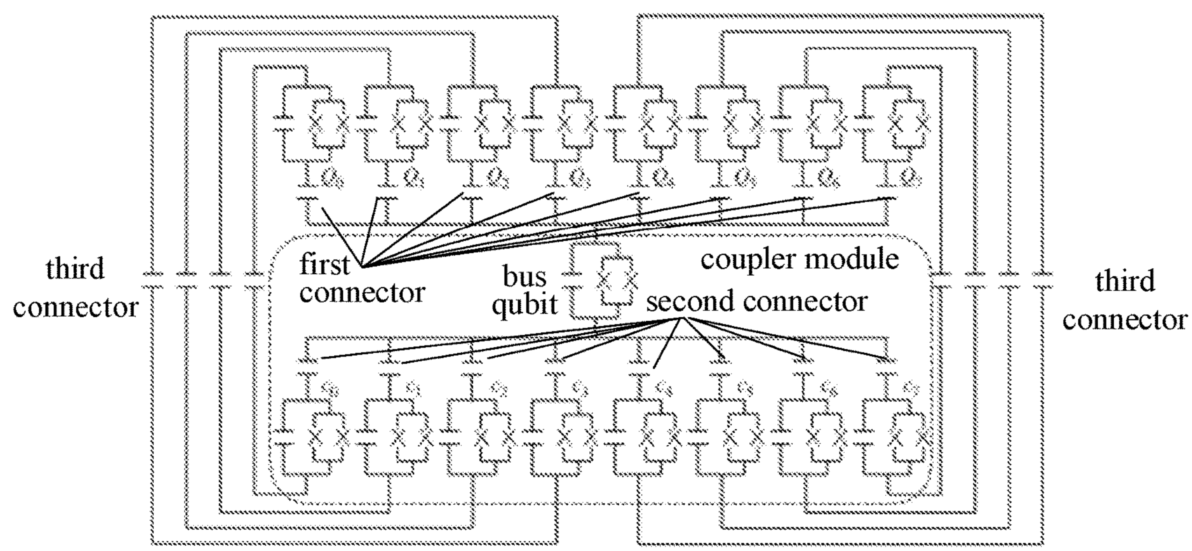
FIG. 5 is a schematic structural diagram showing an implementation of a superconducting circuit structure according to an embodiment of the present application.

FIG. 3 shows a schematic diagram of a superconducting circuit structure according to an embodiment of the present application. FIG. 5 is a schematic diagram showing a circuit implementation of a superconducting circuit structure according to an embodiment of the present application in a specific example. As shown in FIG. 3 and FIG. 5, a superconducting circuit structure includes:

at least three computational qubits; where $Q_0$-$Q_7$ shown in FIG. 3 are all computational qubits;

a bus qubit; where as shown in FIG. 3, the bus qubits, Bus, is connected to the computational qubits $Q_0$-$Q_7$, and couplings between any two of the computational qubits connected by the bus qubit, Bus, are equivalent;

coupler qubits; where $C_0$-$C_7$ shown in FIG. 3 are all coupler qubits, and the coupler qubits are disposed between the computational qubits and the bus qubit, to connect the computational qubits to the bus qubit. The coupler qubit is configured to regulate coupling strength between a computational qubit and a bus qubit.

As shown in FIG. 3, in a specific example, a bus qubit is connected to at least three computational qubits, and the number of coupler qubits is the same as that of computational qubits, that is, one coupler qubit corresponds to one computational qubit. In this way, the coupler qubit may be configured to regulate coupling strength between a computational qubit and a bus qubits.

In a specific example, in order to minimize different types of the introduced devices, a computational qubit, a bus qubit, and a coupler qubit may have a same structure, such as a same qubit structure. Certainly, for actual functional requirements or for other needs, structures of a computational qubit, a bus qubit, and a coupler qubit may also be different, which facilitate engineering applications.

In practical applications, a bus qubit can be a resonator. For example, in a specific example, a resonator includes an inductance, and a resonant structure formed by a capacitor connected in parallel with the inductance. Alternatively, a resonator includes a controllable equivalent inductance, and a capacitor connected in parallel with the controllable equivalent inductance.

In a specific example, a bus qubit includes a superconducting quantum interference device; and/or a computational qubit includes a superconducting quantum interference device; and/or a coupler qubit includes a superconducting quantum interference device. Here, the superconducting quantum interference device includes two Josephson junctions connected in parallel. By a magnetic field generated by a current flowing through a Josephson junction chain in the superconducting quantum interference device, a magnetic flux passing through a computational qubit, a bus qubit or a coupler qubit may be changed, and a frequency of a computational qubit, a bus qubit, or a coupler qubit is changed, so that a frequency adjustment is achieved.

In a specific example, a bus qubit further includes a first noise reduction structure configured to reduce a charge fluctuation noise in an environment in which the bus qubit is located; and/or a computational qubit further includes a second noise reduction structure configured to reduce a charge fluctuation noise in an environment in which the computational qubit is located; and/or a coupler qubit further includes a third noise reduction structure configured to reduce a charge fluctuation noise in an environment in which the coupler qubit is located.

In another specific example, a bus qubit further includes a capacitor connected in parallel with the superconducting quantum interference device, where the capacitor is configured to reduce a charge fluctuation noise in an environment in which the bus qubit is located; and/or a calculational qubit further includes a capacitor connected in parallel with the superconducting quantum interference device, where the capacitor is configured to reduce a charge fluctuation noise in an environment in which the computational qubit is located; and/or a coupler qubit further includes a capacitor connected in parallel with the superconducting quantum interference device, where the capacitor is configured to reduce a charge fluctuation noise in an environment in which the coupler qubit is located.

In practical applications, as shown in FIG. 5, the superconducting circuit structure in an embodiment of the present application, further includes: a first connector, a second connector, and a third connector, where a first end of a bus qubit is connected to a first end of a computational qubit through the first connector, a second end of the bus qubit is connected to a first end of a coupler qubit through the second connector; and a second end of the computational qubit is connected to a second end of the coupler qubit through the third connector.

In a specific implementation, the first connector, the second connector, and the third connector are one of: a capacitor, a Josephson junction, and a resonator, where the first connector, the second connector and the third connector are the same or different.

According to a scheme in embodiments of the present application, since a bus qubit is introduced, computational qubits are indirectly coupled by the bus qubit. In this way, a coupling between any two computational qubits is realized, and a full connectivity of computational qubits is achieved, which facilitates an operation of a quantum gate between any two computational qubits. Additionally, since in an embodiment of the present application, a coupler qubit is introduced and the coupler qubit is disposed between a bus qubit and a computational qubit, coupling strength between a computational qubit and a bus qubit may be regulated by the coupler qubit. Further, a coupling between any two computational qubits may even be turned off by a coupler qubit. Therefore, crosstalk between computational qubits is effectively avoided, which provides a solution for enabling an operation between non-adjacent qubits in a superconducting circuit platform while effectively suppressing crosstalk between computational qubits.

Hereafter, embodiments of the present application will be further described in detail in three parts. Firstly, an architecture of a superconducting circuit structure in a scheme of the present application is described. After that, the working principle of a superconducting circuit structure in a scheme of the present application is analyzed. Finally, it is described how to use basic elements of a superconducting circuit to implement a superconducting circuit structure in a scheme of the present application. The details are as follows.

The first part: an architecture of a superconducting circuit structure. In this example, basic elements are qubits. As shown in FIG. 3, according to functions of qubits in an scheme of the present application, the qubits are divided into three types: a qubit used for calculation, called a computational qubit, which is represented by Q, e.g., $Q_0$-$Q_7$ shown in FIG. 3; a qubit used for connecting different computational qubits, called a bus qubit, which is represented by Bus; a qubit used for adjusting coupling strength between a computational qubit and a bus qubit, called a coupler qubit, which is represented by c, e.g., $c_0$-$c_7$ shown in FIG. 3. In practical applications, a coupler qubit and a bus qubit may be collectively referred to as a coupler module. For example, as shown in FIG. 3, a coupler module includes a bus qubit, Bus, and eight coupler qubits ($c_0$-$c_7$). Furthermore, in each independent qubit, computational qubits are connected by a common bus qubit, so that couplings between any two computational qubits may be equivalent. After that, a coupler qubit is inserted between respective computational qubits and the bus qubit, to adjust coupling strength between the computational qubits and the bus qubit, and when necessary, a coupling therebetween may even be turned off. In this way, crosstalk between two computational qubits may be effectively avoided. It should be noted here that the bus qubit may be replaced by a resonator, by means of which a same function may also be achieved. In the scheme of the present application, in order to involving as few basic units with different types as possible, all basic units are qubits.

Based on the above framework, a two-qubit gate may be implemented between any two computational qubits, that is, any two of $Q_0$-$Q_7$, while crosstalk between computational qubits may be well controlled. For example, as shown in FIG. 3, if a coupling between computational qubits $Q_1$ and $Q_6$ is to be implemented so as to realize an operation of a quantum gate, the coupler qubits $c_1$ and $c_6$ may be adjusted so that the computational qubits $Q_1$ and $Q_6$ are coupled to the bus qubit, while other coupler qubits are adjusted so that couplings between other computational qubits and the bus qubit are turned off. In this way, when a quantum gate between the computational qubits $Q_1$ and $Q_6$ is implemented, other computational qubits will not be affected, thereby achieving an operation of a quantum gate with high fidelity.

Figure 4:
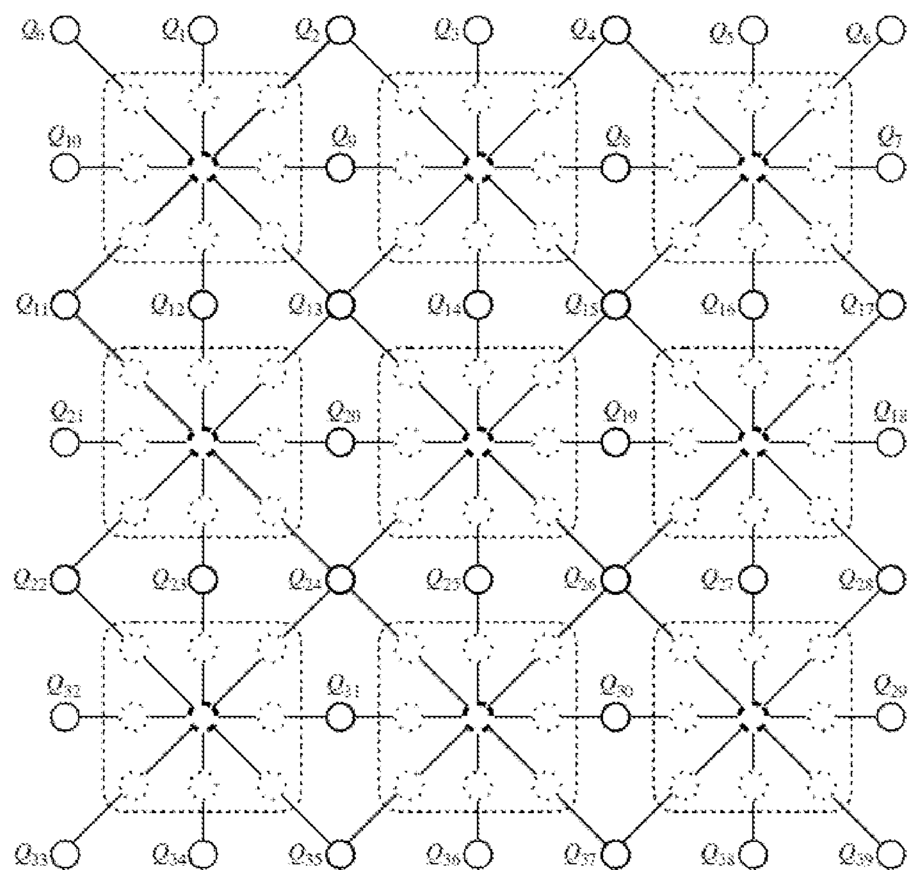
FIG. 4 is a schematic diagram showing an expanded structure obtained by expanding a superconducting circuit structure, according to an embodiment of the present application.

It should be noted that in the scheme shown in FIG. 3, the number of computational qubits coupled to the bus qubit may be selected according to the actual task requirements. Additionally, the superconducting circuit structure shown in FIG. 3 may be only one basic unit. In practical applications, it may also be expanded based on the basic unit for more complex tasks. For example, FIG. 4 illustrates a superconducting circuit structure with an architecture including forty computational qubits, $Q_0$-$Q_{39}$, which is expanded based on the basic unit shown in FIG. 3, where a superconducting qubit structure consisting of nine basic units is included. The structure includes forty computational qubits $Q_0$-$Q_{39}$ and nine bus qubits. Each computational qubit is connected to a bus qubit by a coupler qubit, so there are forty coupler qubits in total. Similarly, each computational qubit may be coupled to other computational qubits by a coupler module, and the couplings are equivalent. For some computational qubits, such as $Q_9$, they may be coupled with 12 adjacent computational qubits to implement operations of a two-qubit gate. For some other computational qubits, such as $Q_{13}$, they may be coupled to 20 adjacent computational qubits to implement operations of a two-qubit gate. More specifically, if an operation of a quantum gate is to be implemented between any two computational qubits, a shortest path in the structure shown in FIG. 4 may be chosen, where the number of quantum gates is exactly the same as that of the bus qubits in the path. For example, if a two-qubit gate is to be implemented between $Q_6$ and $Q_{33}$, the shortest path is exactly the diagonal connecting $Q_6$ and $Q_{33}$, which passes through three bus qubits. In view of this, operations of a two-qubit gate may be implemented sequentially between $Q_6$ and $Q_{15}$, $Q_{15}$ and $Q_{24}$, and $Q_{24}$ and $Q_{33}$. Obviously, the connectivity between computational qubits in a scheme of the present application has been greatly improved. Meanwhile, due to the existence of a coupler qubit, some couplings may be turned off by adjusting the characteristic frequency of the coupler qubit, no additional crosstalk will be introduced in operations of single-qubit gate or in operations of two-qubit gate, thereby realizing a quantum gate with high fidelity. Certainly, the expansion shown in FIG. 4 may be only an example. In practical applications, a superconducting circuit structure may also be extended according to actual requirements.

The second part: the working principle of a superconducting circuit.

In order to understand the working principle of the above-mentioned superconducting circuit structure more clearly, in the scheme of the present application, the Hamiltonian of a superconducting circuit structure is provided and analyzed. Taking the superconducting circuit structure described in FIG. 3 as an example, the Hamiltonian of the structure is:

$$\hat{H}=\sum_{i=0}^{7}\frac{\omega_q^i}{2}\hat{\sigma}_{q,z}^i+\frac{\omega_b}{2}\hat{\sigma}_{b,z}+\frac{\omega_c^i}{2}\hat{\sigma}_{c,z}^i+g_{q-b}^i\left(\hat{\sigma}_{q,+}^i\hat{\sigma}_{b,-}+\hat{\sigma}_{q,-}^i\hat{\sigma}_{b,+}\right)+ g_{b-c}^i\left(\hat{\sigma}_{b,+}\hat{\sigma}_{c,-}^i+\hat{\sigma}_{b,-}\hat{\sigma}_{c,+}^i\right)+g_{q-c}^i\left(\hat{\sigma}_{q,+}^i\hat{\sigma}_{c,-}^i+\hat{\sigma}_{q,-}^i\hat{\sigma}_{c,+}^i\right),; \tag{1}$$

In the equation, the first three terms correspond to a computational qubit, a bus qubit, and a coupler qubit respectively, $\omega_q^l$, $\omega_b$, $\omega_c^l$ are frequencies of the corresponding qubits, $\hat{\sigma}_q^i(c)$, z is a Pauli operator describing the i-th computational (or coupler) qubit, and $\hat{\sigma}_{b,z}$ is a Pauli operator describing the bus qubit; the last three terms represent in turn the couplings between each of the computational qubits and the bus qubit (with the coupling strength $g_{q-b}^i$), the couplings between each of the coupler qubits and the bus qubit (with the coupling strength $g_{b-c}^i$), and the couplings between each of the computational qubits and the corresponding coupler qubits (with the coupling strength $g_{q-c}^i$). The coupling strengths here are all positive, and generally satisfy $g_{b-c}^i$, $g_{b-c}^i \gg g_{q-b}^i$ in experiments.

The Schrieffer-Wolff transformation is performed on the equation (1), in order to obtain a new equivalent coupling generated between the computational qubits after introducing a coupler module. Specifically, let $\hat{H}_1=e^{-s_1}$, where $s_1$ may be described as:

$$s_1=\sum_{i=0}^{7}\left[\frac{g_{b-c}^i}{\omega_b-\omega_c^i}\left(\hat{\sigma}_{b,+}\hat{\sigma}_{c,-}^i-\hat{\sigma}_{b,-}\hat{\sigma}_{c,+}^i\right)+\frac{g_{q-c}^i}{\omega_q^i-\omega_c^i}\left(\hat{\sigma}_{q,+}^i\hat{\sigma}_{c,-}^i-\hat{\sigma}_{q,-}^i\hat{\sigma}_{c,+}^i\right)\right]; \tag{2}$$

In an experiment of superconducting circuit, $g_{b-c}^i$, $g_{q-c}^i \gg g_{q-b}^i$, and dispersive coupling conditions $g_{b-c}^i \gg |\omega_b-\omega_c^i|$ and $g_{q-c}^i \gg |\omega_q^i-\omega_c^i$ may be satisfied, based on which, the following equation may be obtained:

$$\hat{H}_1=\sum_{i=0}^{7}\frac{\tilde{\omega}_q^i}{2}\hat{\sigma}_{q,z}^i+\frac{\tilde{\omega}_b}{2}\hat{\sigma}_{b,z}+g_{q-b}^{i,eff}\left(\hat{\sigma}_{q,+}^i\hat{\sigma}_{b,-}+\hat{\sigma}_{q,-}^i\hat{\sigma}_{b,+}\right),; \tag{3}$$

Where relevant parameters are as follows:

$$\tilde{\omega}_q^i=\omega_q^i+\frac{\left(g_{q-c}^i\right)^2}{\omega_q^i-\omega_c^i},\ \tilde{\omega}_b=\omega_b+\frac{\left(g_{b-c}^i\right)^2}{\omega_b-\omega_c^i}, \quad g_{q-b}^{i,eff}=g_{q-b}^i+\frac{g_{q-c}^i g_{b-c}^i}{2}\left(\frac{1}{\omega_q^i-\omega_c^i}+\frac{1}{\omega_b-\omega_c^i}\right),; \tag{4}$$

It may be seen that based on the Schrieffer-Wolff transformation, the interaction between qubits and couplers (that is, the last two terms in the equation (1)) may be eliminated, and equivalent couplings between computational qubits and a bus qubit are generated instead, that is, couplings of $\hat{\sigma}_q^i$, +$\hat{\sigma}_b$, —+$\hat{\sigma}_q^i$,–$\hat{\sigma}_b$, +type. By comparing the equations (1) and (3), it may be found that after introducing a coupler qubit between a computational qubit and a bus qubit, not only frequencies of qubits themselves are modified, but also effective couplings between respective computational qubits and a bus qubit may be regulated. More importantly, by adjusting the frequency $\omega_c^i$ of each coupler qubit independently and assuming $\omega_c^i > \omega_q^i$, $w_b$ (that is, the frequency of each coupler qubit should be greater than that of the bus qubit, and should also be greater than that of the computational qubit coupled thereto), couplings between each of the computational qubits and the bus qubit may even be turned off.

In the end, a second Schrieffer-Wolff transformation is performed to obtain an equivalent coupling between any two computational qubits, thereby implementing an operation of a two-qubit gate therebetween. Specifically, let $\hat{H}_2=e^{-s_2}\hat{H}_1e^{s_2}$, where $s_2$ may be described as:

$$s_2=\sum_{i=0}^{7}\left[\frac{g_{q-b}^{i,eff}}{\tilde{\omega}_q^i-\tilde{\omega}_b}\left(\hat{\sigma}_{q,+}^i\hat{\sigma}_{b,-}-\hat{\sigma}_{q,-}^i\hat{\sigma}_{b,+}\right)\right], \tag{5}$$

In an experiment of superconducting circuit, the dispersive coupling condition $g_{q-b}^{i,eff} \gg |\tilde{\omega}_q^i-\tilde{\omega}_b|$ may be satisfied, based on which, the following equation may be obtained:

$$\hat{H}_2=\sum_{i=0}^{7}\frac{\varpi_q^i}{2}\hat{\sigma}_{q,z}^i+g_{q-q}^{ij,eff}\left(\hat{\sigma}_{q,+}^i\hat{\sigma}_{q,-}^j+\hat{\sigma}_{q,-}^i\hat{\sigma}_{q,+}^j\right),; \tag{6}$$

Where relevant parameters are as follows:

$$\varpi_q^i=\tilde{\omega}_q^i+\left(g_{q-b}^{i,eff}\right)^2/\left(\tilde{\omega}_q^i-\tilde{\omega}_b\right), \quad g_{q-q}^{ij,eff}=\frac{g_{q-b}^{i,eff}g_{q-b}^{j,eff}}{2}\left(\frac{1}{\tilde{\omega}_q^i-\tilde{\omega}_b}+\frac{1}{\tilde{\omega}_q^j-\tilde{\omega}_b}\right),; \tag{7}$$

As shown in equation (6), by the transformation, an equivalent coupling between any two computational qubits (that is, the last term in the equation (6)) is finally obtained. In view of the coupling form, it may be directly used to implement a two-qubit iSWAP gate. Specifically, by adjusting the effective frequencies of two computational qubits to make them resonate, that is, $\overline{\omega}_q^{\,i}=\overline{\omega}_q^{\,j}$, and then let the system dynamics evolve for a period of time t, the evolution operator U of the system is:

$$U(t)=e^{-i g_{q-q}^{ij,eff}(\hat{\sigma}_{q,+}^{i}\hat{\sigma}_{q,-}^{j}+\hat{\sigma}_{q,-}^{i}\hat{\sigma}_{q,+}^{j})t}, \quad (8);$$

Transforming the equation (8) into a matrix form:

$$U(t)=\begin{pmatrix} 1 & 0 & 0 & 0 \\ 0 & \cos\left(g_{q-q}^{ij,eff}t\right) & -i\sin\left(g_{q-q}^{ij,eff}t\right) & 0 \\ 0 & -i\sin\left(g_{q-q}^{ij,eff}t\right) & \cos\left(g_{q-q}^{ij,eff}t\right) & 0 \\ 0 & 0 & 0 & 1 \end{pmatrix} \equiv iSWAP, ; \quad (9)$$

When the evolution time $t=\pi/(2g_{q-q}^{ij,eff})$, an iSWAP gate may be obtained. Additionally, when the evolution time $t=\pi/(4g_{q-q}^{ij,eff})$, a $\sqrt{\text{iSWAP}}$ gate may be realized. Since crosstalk between qubits in a superconducting circuit may be eliminated by modulating a coupler module, the fidelity of the iSWAP gate or the $\sqrt{\text{iSWAP}}$ gate will be improved. Furthermore, the iSWAP gate or the $\sqrt{\text{iSWAP}}$ gate may be combined with a single-bit revolving gate, to form a group of universal qubit gate for quantum computing.

The third part: an implementation of a superconducting circuit structure.

In this part, it is shown how to use basic elements (such as a capacitor, an inductance, Josephson junctions) of a superconducting circuit to implement superconducting circuit structure in a scheme of the present application. In view of that a final superconducting circuit structure is a combination of basic units, only the superconducting circuit structure corresponding to that in FIG. 3 needs to be given. For an extended scheme (such as that in FIG. 4), it may be obtained easily, and will not be repeated here.

FIG. 5 is an implementation of the superconducting circuit structure shown in FIG. 3. As shown in FIG. 5, there are 17 qubits in total. Each qubit includes a superconducting quantum interference device (which generally includes two Josephson junctions (indicated by symbol 'X') connected in parallel, and may adjust the frequency of a qubit by applying externally a magnetic flux) and a capacitor connected in parallel therewith. As shown in FIG. 5, the computational qubits $Q_0$-$Q_7$ lie in the top row, and the part of dotted box corresponds to coupler modules. A bus qubit and 8 coupler qubits $c_0$-$c_7$ are contained in a coupler module. By adjusting frequencies of the coupler qubits in the coupler module, couplings of any two computational qubits may be realized, thereby realizing a two-qubit gate with high fidelity. Additionally, the bus qubit is connected, respectively, to each of the computational qubits and the coupler qubits by an independent capacitor, and the computational qubits and the coupler qubits are also coupled together by capacitors. The superconducting circuit structure may be described by the Hamiltonian in equation (1) above-mentioned, so it also follows the working principle of the superconducting circuit discussed above.

By applying a scheme of the present application, a fully connected quantum computing between qubits may be realized in a superconducting circuit platform, which will undoubtedly greatly improve the efficiency of quantum computing. Besides the advantage, the scheme of the present application also has the following advantages:

First, the issues of connectivity and crosstalk between superconducting qubits are effectively solved. That is, by introducing a bus qubit and a coupler qubit, it is possible to effectively avoid crosstalk between computational qubits, while a full connectivity of the computational qubits is achieved.

Secondly, the scheme is simple and easy to expand. That is, both the architecture of the superconducting circuit structure itself and the implementation of the superconducting circuit in the architecture are relatively simple. Further, all basic elements in the scheme of the present application may adopt superconducting qubits, and only the functions of the qubits need to be distinguished, so that the preparation and development of superconducting circuit chips are easier and more efficient.

Thirdly, since the issues of connectivity and crosstalk between multiple qubits are solved, it is expected that a quantum algorithm (task) may be implemented more efficiently, thereby greatly improving the problem solving ability.

In an embodiment of the present application, a superconducting quantum chip is provided. At least a superconducting circuit structure is formed on the superconducting quantum chip, where the superconducting circuit structure includes:

at least three computational qubits;

a bus qubit, connected to the respective computational qubits, where couplings between two of the computational qubits connected by the bus qubit are equivalent; and coupler qubits disposed between the respective computational qubits and the bus qubit, to connect the respective computational qubits to the bus qubit, wherein the coupler qubit is configured to regulate coupling strength between the computational qubit and the bus qubit.

It should be noted here that the superconducting circuit structure in the above superconducting quantum chip is similar to the above structure, and has the same beneficial effects as that in the above-mentioned embodiment of the superconducting circuit structure, so it will not be repeated here. For technical details not disclosed in the embodiment of the superconducting quantum chip of the present application, those skilled in the art may understand by referring to the above descriptions of the superconducting structure. To avoid redundancy, it will not be repeated here.

In an embodiment of the present application, a superconducting quantum computer is provided, which is provided at least with a superconducting quantum chip and a control and reading device connected to the superconducting quantum chip, where the superconducting quantum chip has the superconducting circuit structure including:

at least three computational qubits;

a bus qubit, connected to the respective computational qubits, where couplings between two of the computational qubits connected by the bus qubit are equivalent; and coupler qubits disposed between the respective computational qubits and the bus qubit, to connect the respective computational qubits to the bus qubit, wherein the coupler qubit is configured to regulate coupling strength between the computational qubit and the bus qubit.

It should be noted here that the superconducting circuit structure in the above superconducting quantum computer is similar to the above structure, and has the same beneficial effects as that in the above-mentioned embodiment of the superconducting circuit structure, so it will not be repeated here. For technical details that are not disclosed in the embodiment of the superconducting quantum computer of the present application, those skilled in the art may understand by referring to the description of the superconducting structure described above. To avoid redundancy, it will not be repeated here.

It should be understood the steps in the various processes described above may be reordered or omitted, or other steps may be added therein. For example, the steps described in the application may be performed parallelly, sequentially, or in different orders, as long as the desired results of the technical solutions disclosed in the application may be achieved, to which no limitation is made herein.

The embodiments above do not constitute a limitation on the protection scope of the present application. It should be understood by those skilled in the art that various modifications, combinations, sub-combinations, and substitutions may be available according to design requirements and other factors. Any modifications, equivalent replacements and improvements made within the spirit and principle of the present application shall be covered within the protection scope of the present application.

What is claimed is:

1. A superconducting circuit structure, comprising:

at least three computational qubits;

a bus qubit connected to the at least three computational qubits, wherein couplings between two of the at least three computational qubits connected by the bus qubit are equivalent;

at least three coupler qubits, wherein a number of coupler qubits is same as a number of computational qubits, wherein each of the at least three coupler qubits is disposed between a respective computational qubit and the bus qubit, to connect the respective computational qubit to the bus qubit, and the each of the at least three coupler qubits is configured to regulate coupling strength between the respective computational qubit and the bus qubit; and a first connector, a second connector, and a third connector, wherein a first end of the bus qubit is connected to a first end of each of the at least three computational qubits through the first connector, a second end of the bus qubit is connected to a first end of each of the at least three coupler qubits through the second connector, and a second end of each of the at least three computational qubits is connected to a second end of a respective coupler qubit through the third connector.

2. The superconducting circuit structure according to claim 1, wherein each of the at least three computational qubits, the bus qubit, and each of the at least three coupler qubits have a same circuit structure or different circuit structures.

3. The superconducting circuit structure according to claim 1, wherein the bus qubit is a resonator.

4. The superconducting circuit structure according to claim 2, wherein the bus qubit is a resonator.

5. The superconducting circuit structure according to claim 1, wherein the bus qubit comprises a superconducting quantum interference device.

6. The superconducting circuit structure according to claim 1, wherein each of the at least three computational qubits comprises a superconducting quantum interference device.

7. The superconducting circuit structure according to claim 1, wherein each of the at least three coupler qubits comprises a superconducting quantum interference device.

8. The superconducting circuit structure according to claim 5, wherein the superconducting quantum interference device comprises two Josephson junctions connected in parallel.

9. The superconducting circuit structure according to claim 6, wherein the superconducting quantum interference device comprises two Josephson junctions connected in parallel.

10. The superconducting circuit structure according to claim 7, wherein the superconducting quantum interference device comprises two Josephson junctions connected in parallel.

11. The superconducting circuit structure according to claim 5, wherein the bus qubit further comprises a first noise reduction structure configured to reduce a charge fluctuation noise in an environment in which the bus qubit is located.

12. The superconducting circuit structure according to claim 6, wherein each of the three computational qubits further comprises a second noise reduction structure configured to reduce a charge fluctuation noise in an environment in which the respective computational qubit is located.

13. The superconducting circuit structure according to claim 7, wherein each of the three coupler qubits further comprises a third noise reduction structure configured to reduce a charge fluctuation noise in an environment in which the respective coupler qubit is located.

14. The superconducting circuit structure according to claim 5, wherein the bus qubit further comprises a capacitor connected in parallel with the superconducting quantum interference device, wherein the capacitor is configured to reduce a charge fluctuation noise in an environment in which the bus qubit is located.

15. The superconducting circuit structure according to claim 6, wherein each of the at least three computational qubits further comprises a capacitor connected in parallel with the superconducting quantum interference device, wherein the capacitor is configured to reduce a charge fluctuation noise in an environment in which the respective computational qubit is located.

16. The superconducting circuit structure according to claim 7, wherein each of the at least three coupler qubits further comprises a capacitor connected in parallel with the superconducting quantum interference device, wherein the capacitor is configured to reduce a charge fluctuation noise in an environment in which the coupler qubit is located.

17. The superconducting circuit structure according to claim 1, wherein the first connector, the second connector, and the third connector are at least one of: a capacitor, a Josephson junction, and a resonator, wherein the first connector, the second connector, and the third connector are the same or different.

18. A superconducting quantum chip, wherein at least a superconducting circuit structure is formed on the superconducting quantum chip, wherein the superconducting circuit structure comprises:

at least three computational qubits;

a bus qubit connected to the at least three computational qubits, wherein couplings between two of the at least three computational qubits connected by the bus qubit are equivalent;

at least three coupler qubits, wherein a number of coupler qubits is same as a number of computational qubits, wherein each of the at least three coupler qubits is disposed between a respective computational qubit and the bus qubit, to connect the respective computational qubits to the bus qubit, and the each of the at least three coupler qubits is configured to regulate coupling strength between the respective computational qubit and the bus qubit; and a first connector, a second connector, and a third connector, wherein a first end of the bus qubit is connected to a first end of each of the at least three computational qubits through the first connector, a second end of the bus qubit is connected to a first end of each of the at least three coupler qubits through the second connector, and a second end of each of the at least three computational qubits is connected to a second end of a respective coupler qubit through the third connector.

19. A superconducting quantum computer, provided at least with a superconducting quantum chip and a control and reading device connected to the superconducting quantum chip, wherein a superconducting circuit structure is formed on the superconducting quantum chip and the superconducting circuit structure comprises:

at least three computational qubits;

a bus qubit connected to the at least three computational qubits, wherein couplings between two of the at least three computational qubits connected by the bus qubit are equivalent;

at least three coupler qubits, wherein a number of coupler qubits is same as a number of computational qubits, wherein each of the at least three coupler qubits is disposed between a respective computational qubit and the bus qubit, to connect the respective computational qubits to the bus qubit, and the each of the at least three coupler qubits is configured to regulate coupling strength between the respective computational qubit and the bus qubit;

a first connector, a second connector, and a third connector, and wherein a first end of the bus qubit is connected to a first end of each of the at least three computational qubits through the first connector, a second end of the bus qubit is connected to a first end of each of the at least three coupler qubits through the second connector, and a second end of each of the at least three computational qubits is connected to a second end of a respective coupler qubit through the third connector.

* * * * *